United States Patent
Franosch et al.

(10) Patent No.: US 7,300,823 B2
(45) Date of Patent: Nov. 27, 2007

(54) APPARATUS FOR HOUSING A MICROMECHANICAL STRUCTURE AND METHOD FOR PRODUCING THE SAME

(75) Inventors: Martin Franosch, Munich (DE); Andreas Meckes, Munich (DE); Winfried Nessler, Munich (DE); Klaus-Gunter Oppermann, Holzkirchen (DE)

(73) Assignee: Infineon Technologies AG (DE)

( * ) Notice: Subject to any disclaimer, the term of this patent is extended or adjusted under 35 U.S.C. 154(b) by 328 days.

(21) Appl. No.: 10/992,627

(22) Filed: Nov. 17, 2004

(65) Prior Publication Data
US 2005/0146022 A1   Jul. 7, 2005

(30) Foreign Application Priority Data
Nov. 17, 2003   (DE) ............... 103 53 767

(51) Int. Cl.
*H01L 21/00* (2006.01)
*H01L 21/76* (2006.01)
*H01L 21/30* (2006.01)

(52) U.S. Cl. ............ 438/126; 438/127; 438/422; 438/456; 438/977; 257/E23.128; 257/E23.191; 257/E21.502

(58) Field of Classification Search ............ None
See application file for complete search history.

(56) References Cited

U.S. PATENT DOCUMENTS

| | | | |
|---|---|---|---|
| 5,331,344 A * | 7/1994 | Miyagawa et al. | 347/65 |
| 5,478,606 A * | 12/1995 | Ohkuma et al. | 427/555 |
| 5,945,260 A * | 8/1999 | Miyagawa et al. | 430/320 |
| 6,346,484 B1 * | 2/2002 | Cotte et al. | 438/725 |
| 6,413,852 B1 * | 7/2002 | Grill et al. | 438/619 |
| 6,454,160 B2 * | 9/2002 | Gueissaz | 228/256 |
| 6,461,798 B1 * | 10/2002 | Ohkuma et al. | 430/320 |
| 6,582,890 B2 * | 6/2003 | Dentinger et al. | 430/322 |
| 6,614,092 B2 * | 9/2003 | Eldridge et al. | 257/522 |
| 6,930,364 B2 * | 8/2005 | Bruner | 257/414 |
| 6,951,380 B2 * | 10/2005 | Kubota et al. | 347/20 |
| 6,960,424 B2 * | 11/2005 | Miyagawa et al. | 430/320 |
| 6,986,980 B2 * | 1/2006 | Kubota et al. | 430/156 |
| 2001/0004085 A1 * | 6/2001 | Gueissaz | 228/124.6 |
| 2002/0037603 A1 * | 3/2002 | Eldridge et al. | 438/112 |

(Continued)

FOREIGN PATENT DOCUMENTS

DE   102 00 869 A1   7/2003

(Continued)

OTHER PUBLICATIONS

Tseng, F.G. et al.; "A Novel Fabrication Method of Embedded Micro Channels Employing Simple UV Dosage Control and Antireflection Coating"; IEEE Feb. 2002, pp. 69-72.

*Primary Examiner*—David E. Graybill
(74) *Attorney, Agent, or Firm*—Dickstein, Shapiro, LLP.

(57) ABSTRACT

Apparatus for housing a micromechanical structure, and a method for producing the housing. The apparatus has a substrate having a main side on which the micromechanical structure is formed, a photo-resist material structure surrounding the micromechanical structure to form a cavity together with the substrate between the substrate and the photo-resist material structure, wherein the cavity separates the micromechanical structure and the photo-resist material structure and has an opening, and a closure for closing the opening to close the cavity.

3 Claims, 13 Drawing Sheets

U.S. PATENT DOCUMENTS

| | | | |
|---|---|---|---|
| 2002/0121909 A1* | 9/2002 | Sato et al. | 324/686 |
| 2003/0011655 A1* | 1/2003 | Miyagawa et al. | 347/20 |
| 2003/0127740 A1* | 7/2003 | Hsu et al. | 257/758 |
| 2003/0155643 A1* | 8/2003 | Freidhoff | 257/704 |
| 2004/0070643 A1* | 4/2004 | Kubota et al. | 347/20 |
| 2004/0131957 A1* | 7/2004 | Kubota et al. | 430/15 |

FOREIGN PATENT DOCUMENTS

| | | |
|---|---|---|
| DE | 102 06 919 A1 | 8/2003 |
| EP | 851295 A1 * | 7/1998 |

* cited by examiner

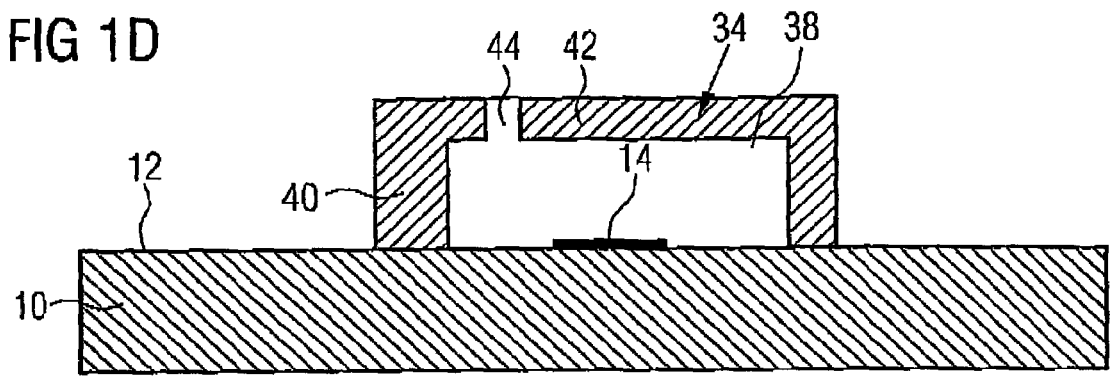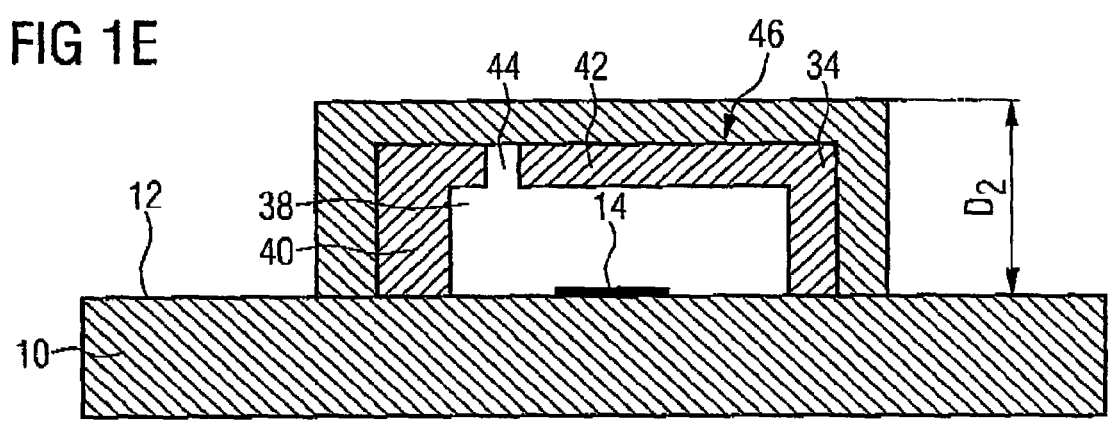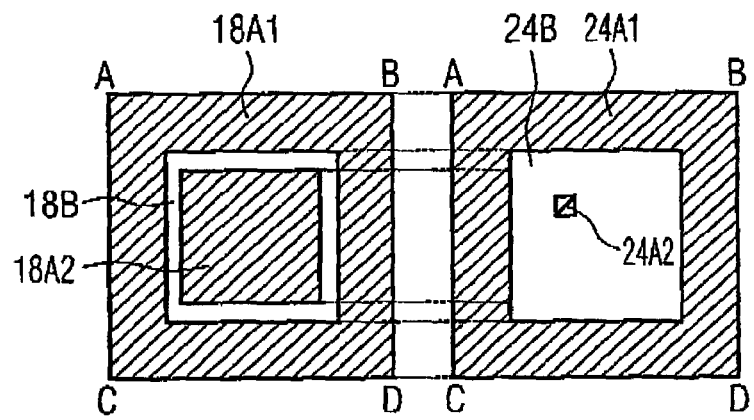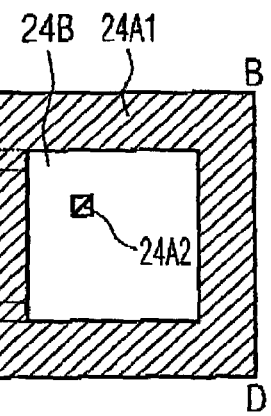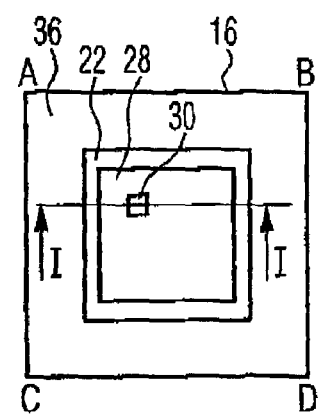

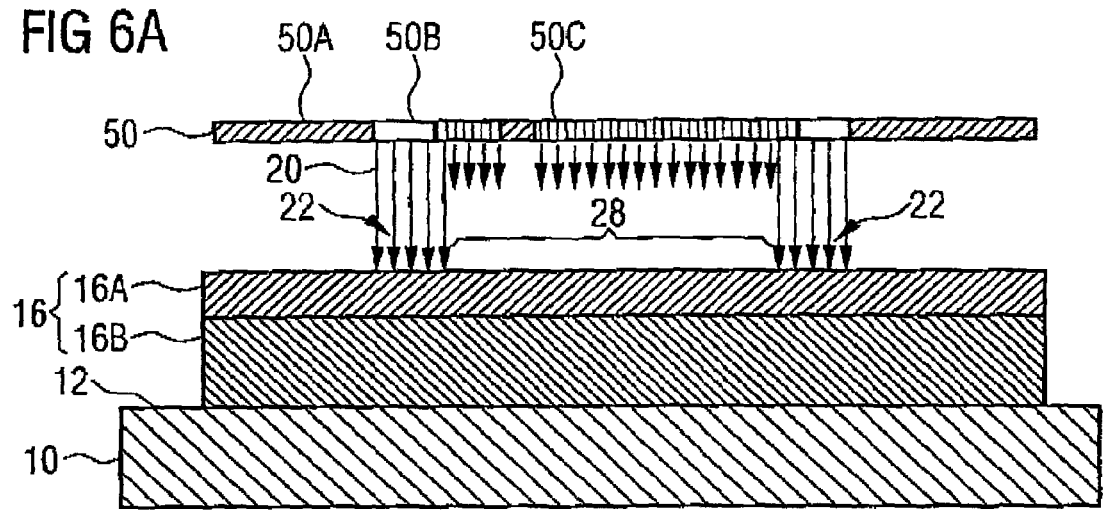
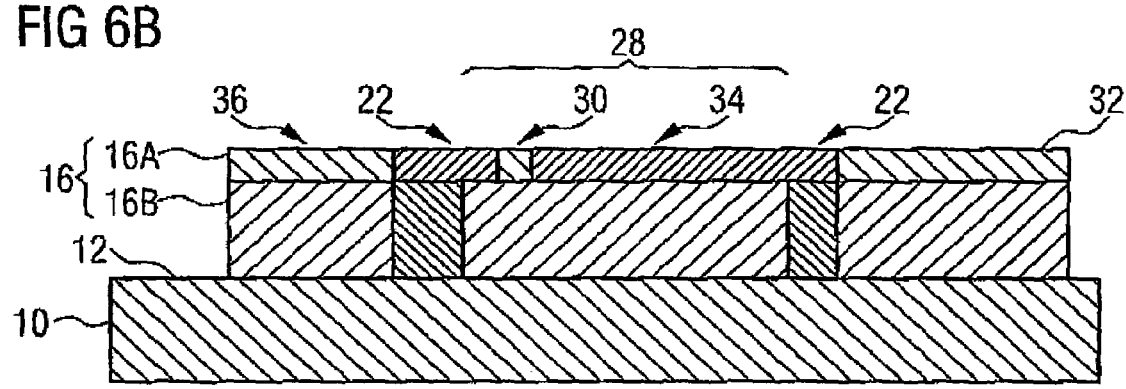

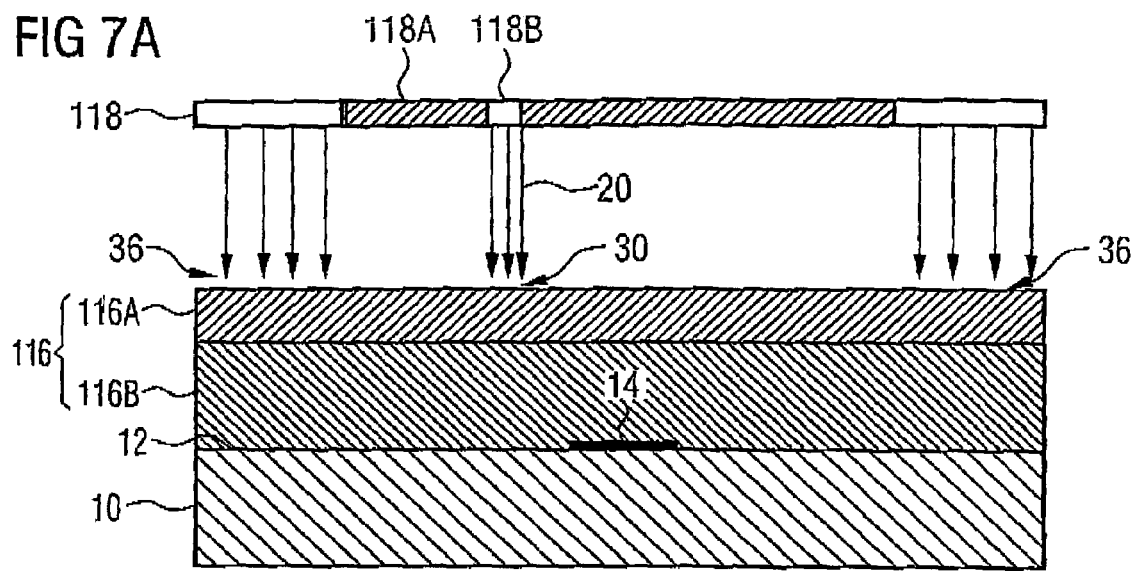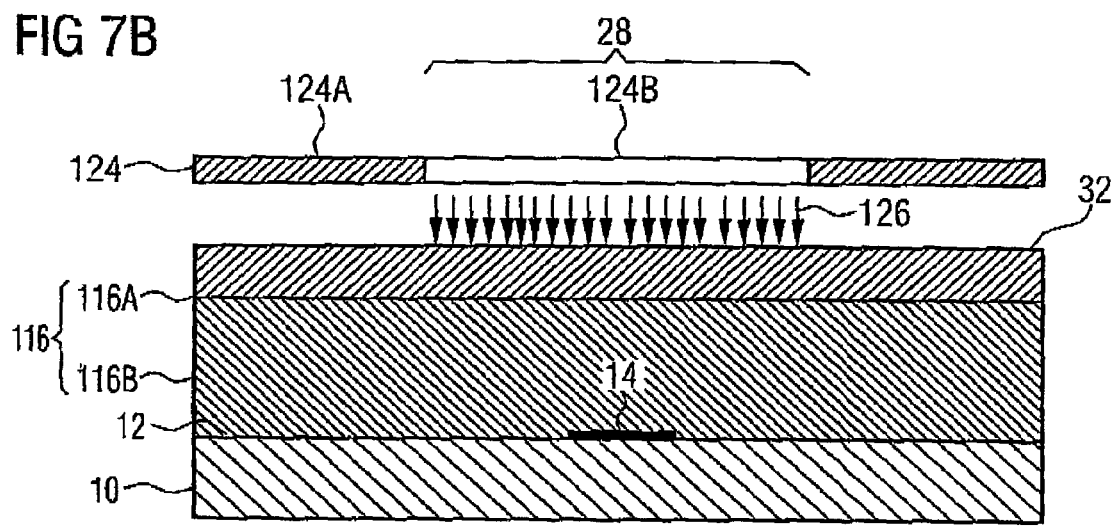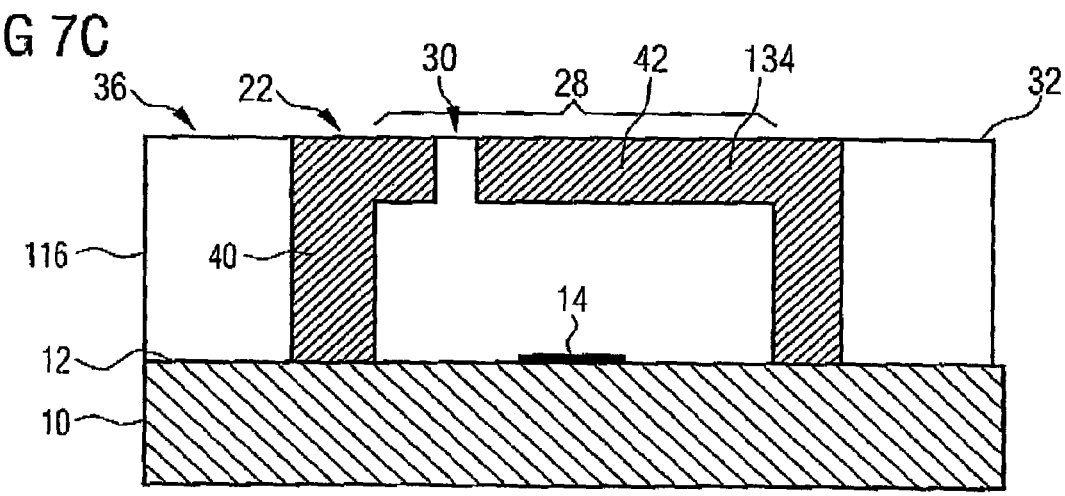

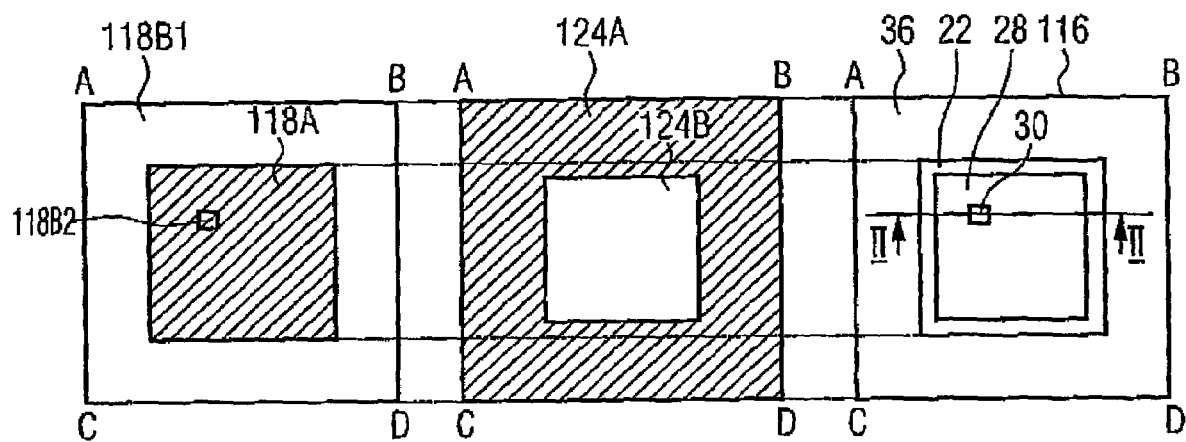

APPARATUS FOR HOUSING A MICROMECHANICAL STRUCTURE AND METHOD FOR PRODUCING THE SAME

CROSS-REFERENCE TO RELATED APPLICATION

This application claims priority from German Patent Application No. 10353767.8, which was filed on Nov. 17, 2003 and is incorporated herein by reference in its entirety.

BACKGROUND OF THE INVENTION

1. Field of the Invention

The present invention relates to the housing of micromechanical structures, such as of bulk acoustic wave (BAW) filters, surface acoustic wave (SAW) filters, resonators, sensors, such as gyroscopes or actuators, such as micropumps or the same.

2. Description of the Related Art

Chips with micromechanical structures and so-called micromechanic circuits, respectively, have an increasing share of the market in high-frequency switches and frequency filters. One of the main markets for such chips with micromechanical structures is the mobile radio market. A chip with a micromechanical structure, which is also referred to as micromechanical circuit, is a semiconductor apparatus on the surface of which a micromechanical structure is implemented. Particular housing technologies are required for such circuits, wherein the housing has to establish a cavity around the micromechanical structure.

A procedure for housing a chip with a micromechanical structure common in the prior art is to insert housing elements with a cavity consisting of ceramic. These ceramic housing structures are both too expensive and too large for the current technology requirements. Typical dimensions of such ceramic housings for a chip with a micromechanical structure are at about 3 mm×3 mm×1.3 mm. With common ceramic housing technologies, these dimensions cannot be reduced any further.

Thus, an alternative process provides for bonding wafers with micromechanical structures, so-called system wafers, wherefrom the chips with micromechanical structures will then be diced, with a second wafer, the so-called cap wafer, wherein recesses and holes are etched, so that the recesses of the second wafer form cavities over the sensitive structures of the first wafer and the holes in the second wafer make the contact pads of the first wafer accessible. Thereby, the sensitive structures are protected. With this technique, housings with significantly smaller dimensions than the previously mentioned ceramic housings can be obtained. However, the relatively expensive production process which comprises sacrificial layer process steps and bond process steps, is disadvantageous.

Thus, it would be desirable to have a possibility to provide and house micromechanical structures with a cavity, respectively, which also enables small dimensions but reduces the production effort.

US 2002/0006588 A1 describes a method for producing 3D structures with continuously varying topographical properties and characteristics in photo-sensitive epoxid resists. Particularly, the same describes the possibility of obtaining 3D structures on a first main surface of a substrate by using a negative resist, namely SU-8 produced by Microchem Corp. and Sotec Microsystems SA, by exposing the negative resist through the substrate from a second main side of the substrate opposite to the first main side. Thereby, so the statement of the US 2002/0006588 A1, the problem would be solved that when exposing the negative resist from the other side, namely directly and not through the substrate, the polymerisazion of the negative resist would start at the side of the negative resist facing away from the substrate, since the light would be increasingly weakened with increasing penetration depth by the polymerization process, so that when developing the cross-linked and polymerized negative resist film, respectively; would detach from the substrate. For generating the continuously changing 3D structures, the document suggests to sample the negative resist through the substrate with a modulated light beam or to use a gray-shade mask.

In F. G. Tseng, Y. J. Chuang, W. K. Lin: A novel fabrication method of embedded micro channels employing simple UV dose control and antireflection coating, IEEE, 02/2002 the usage of a time-controlled UV exposure at thick SU-8 resists combined with an antireflex coating on the lower surface of the resist is suggested for producing a multi-layer arrangement of embedded micro-fluidic channels. The article suggests to deposit first an antireflex coating and then an SU-8 resist layer on a substrate. Then, in two exposing steps, the parts outside the desired channels are exposed, the channel walls with a high dose to cross-link them continuously, and the channel region with a lower dose, wherein a certain channel ceiling thickness results depending on the dose. An opening region in the channel region is covered in the second exposing step to not cross-link the same so that an opening in the channel ceiling results in the final developing step. Further micro-channel layers are generated in the same way, i.e. by depositing an antireflex coating and subsequent depositing of a negative resist, exposing with different dose values, depositing a next antireflex coating, etc. Then, all micro-channel layers are developed in a common developing step, by using the opening of the last produced micro-channel layer, wherein care should be taken that also the antireflex coatings between adjacent negative resist layers clear the developing path for the lower channels.

SUMMARY OF THE INVENTION

It is an object of the present invention to provide an apparatus for housing a micromechanical structure and a method for producing such an apparatus, so that the production of small housings for chips with micromechanical structures is achieved with less effort.

In accordance with a first aspect, the present invention provides an apparatus for housing a micromechanical structure, having a substrate with a main side on which the micromechanical structure is formed; a photo-resist material structure surrounding the micromechanical structure to form a cavity together with the substrate between the substrate and the photo-resist material structure, wherein the cavity separates the micromechanical structure and the photo-resist material structure and which has an opening; and a closure for closing the opening to close the cavity.

In accordance with a second aspect, the present invention provides a method for producing an apparatus for housing the micromechanical structure, having the steps of: a) providing a substrate with a main side on which the micromechanical structure is formed; b) depositing photo-resist material on the main side of the substrate; c) exposing and subsequently developing the photo-resist material so that a photo-resist material structure is obtained from the photo-resist material, wherein the photo-resist material structure surrounds the micromechanical structure to form together with the substrate a cavity between the substrate and the photo-resist material structure, and wherein the cavity separates the micromechanical structure and the photo-resist material structure and which has an opening; and d) closing the opening to close the cavity.

It is the knowledge of the present invention that for the required housing and provision of a cavity, respectively, round the micromechanical structure on a substrate, such as a wafer, for packaging the same subsequently in a housing, such as by a molding and casting process, respectively, a photo-resist material structure can also be used, for the production of which no sacrificial layer or wafer bond processes are required. The consideration was also that with selectively exposing alone it is not possible to produce a closed cavity, since in the case of using a negative resist the not cross-linked and in the case of a positive resist the bleached photo-resist has to be somehow removable during the developing step from the region, which later represents the inner part of the cavity, but that it is easily possible to close or seal this opening required for the developing step later to obtain a closed cavity.

According to an embodiment of the present invention, the photo-resist material structure defining the cavity is formed of only a single negative resist layer. In a wall region, the negative resist layer is exposed with a higher dose than in a cap region surrounding the wall region, wherein an opening region within the cap region is not exposed at all. Thus, a later developing step leads to a photo-resist material structure with a cap portion and member, respectively, and a wall portion and wall member, respectively, which surround the micromechanical structure on the substrate.

In order to extend the process window for the exposure dose of the cap layer and the cap portion, respectively, and to increase the accuracy, respectively, by which the thickness of the cap portion can be set, according to a second embodiment of the present invention the photo-resist material structure is formed of two negative resist layers, which are deposited on top of one another on the substrate, wherein the negative resist layer further apart from the substrate has a higher resist sensitivity than the negative resist layer on the substrate.

According to a further embodiment of the present invention, the photo-resist material structure is formed of two positive resist layers, wherein the positive resist layer further away from the substrate has a lower resist sensitivity than the positive resist layer disposed therebetween. In this embodiment, the opening region is exposed with a first dose and the cap region with a second lower dose. The advantage of this method is the high number of available positive resist materials and the possibility of producing smaller lateral structures due to the better contrast compared to negative resists and their lower tendency to swell.

According to an embodiment of the present invention, for covering the opening to close the cavity, a cureable polymer is used, whose viscosity is more than 2000 cST in an uncured state, in order to avoid an inflow of the polymer into the cavity when depositing the same prior to the curing process.

BRIEF DESCRIPTION OF THE DRAWINGS

These and other objects and features of the present invention will become clear from the following description taken in conjunction with the accompanying drawings, in which:

FIG. 1a-e are schematical sectional views as they result during the production of an apparatus for housing a micromechanical structure according to an embodiment of the present invention to illustrate the individual method steps and the states resulting after the individual method steps, respectively;

FIG. 2a is a top view of the mask used in the method step of FIG. 1a;

FIG. 2b is a top view of the mask used in the method step of FIG. 1c;

FIG. 2c is a top view of the negative resist layer, wherein the regions exposed with different doses in the steps of FIG. 1a and FIG. 1b are illustrated;

FIG. 5 is a top view of the mask used in the method step of FIG. 4a;

FIG. 6a,b are schematical sectional views as they result during the production of an apparatus for housing a micromechanical structure according to a further embodiment of the present invention to illustrate the individual method steps and the states resulting after the individual method steps, respectively;

FIG. 7a-e are schematical sectional views as they result during the production of an apparatus for housing a micromechanical structure according to a further embodiment of the present invention to illustrate the individual method steps and the states resulting after the individual method steps, respectively;

FIG. 8a is a top view of the mask used in the method step of FIG. 7a;

FIG. 8b is a top view of the mask used in the method step of FIG. 7b;

FIG. 8c is a top view of the positive resist layer wherein the regions exposed with different doses in the steps of FIGS. 7a and 7b are illustrated;

DESCRIPTION OF THE PREFERRED EMBODIMENTS

Before the present invention will be discussed in more detail with reference to the following figures, it should be noted that the same or similar elements in the figures are provided with the same or similar reference numbers and that a repeated description of these elements is omitted.

With reference to FIGS. 1a-1e, first, an embodiment for producing an apparatus for housing a micromechanical structure is described, wherein a photo-resist material structure of negative resist, which is formed of only a single negative resist layer, is used for housing.

Figure 1A:
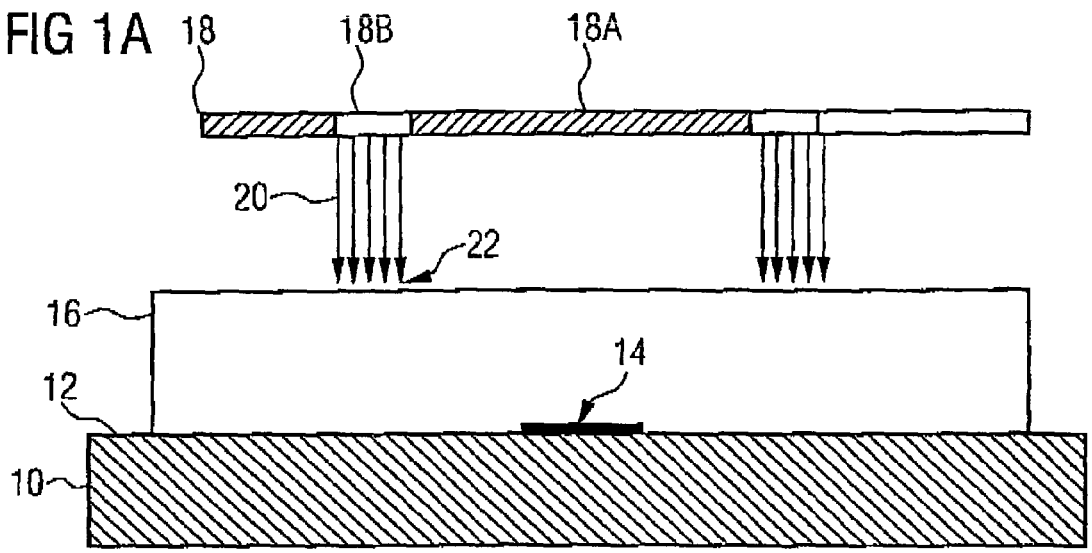

As shown in FIG. 1a, first, the substrate 10 is provided, at the main side and upper side 12, respectively, of which the micromechanical structure 14 to be housed is formed. The substrate is, for example, a wafer, wherein apart from the micromechanical structure 14 shown in FIG. 1a further micromechanical structures 14 are formed, and which is diced after performing the following method steps, in order to form several chips with on-chip cavities around the micromechanical structures from the substrate 10. The term "chip" means any semiconductor apparatus where a micromechanical structure is formed. A BAW filter, for example, is possible as a micromechanical structure. The substrate could, of course, also consist of different materials than semiconductor materials. In addition, the substrate could be formed as a system wafer where on the surface 12 of the substrate 14 other, not shown structures are formed, such as an integrated circuit and particularly contact pads which will be discussed below.

A resist layer 16 of negative resist is deposited on the provided substrate 10. For example, the negative resist SU-8 can be used as negative resist. A deposition is performed, for example, via spin coating. This spin coating can be repeated several times for building up a desired layer thickness which fixes the height of the photo-resist material structure to be realized later. For increased adhesion, an adhesion promoter can be vapor deposited on the surface 12 of the substrate 10 prior to spinning or dropped on the same in dissolved form and then spun off. The state resulting after the deposition of the negative resist layer 16 can be seen in FIG. 1a.

FIG. 1a represents a moment of production during the subsequent method step. In this method step, the negative resist layer 16 is selectively exposed via a first mask 18, as illustrated by arrows 20. The exposure is performed at a wave length where the negative resist of the layer 16 is sensitive, i.e. cross-linked. The exposed and cross-linked, respectively, parts remain in a negative resist compared to the unexposed parts of the same in a subsequently performed and later described developing step, while the unexposed parts are dissolved out during the developing step. Whether a specific part of the negative resist 16 remains during developing or not depends on whether it has been exposed sufficiently, i.e. that it has been exposed with a sufficiently high dose. Since the dose indicates the exposure energy per area unit, with which a certain location is exposed and the energy decreases with increasing penetration depth due to the absorption of light in the cross-link processes, the exposure dose which the negative resist experiences in layer 16 is reduced with increasing penetration depth. With progressive exposure time, however, the light absorption is reduced since the not cross-linked portion of the negative resist in layer 16 constantly decreases. In the step of FIG. 1a, the exposure dose which is the product of light intensity of light 20 and exposure time, is chosen such that the resist layer 16 is exposed at the exposed locations across the whole layer thickness sufficiently to cross-link and to remain during developing. This minimum dose for a complete cross-link across the whole layer thickness depends on the resist sensitivity of the negative resist material of layer 16 and is the smaller, the higher the sensitivity.

The mask 18 limits the exposure of the step in FIG. 1a laterally, i.e. in extension direction of the resist layer 16, to a frame region 22. The frame region 22 surrounds the location where the micromechanical structure 14 is formed, laterally in the form of a closed strip. Therefore, the mask 18 is opaque except for a strip-shaped region corresponding to the frame region 22, wherein in FIG. 1a the opaque part of the mask 18 which blocks the exposure light 20 is indicated with 18a and the opaque part which transmit the exposure light 20 with 18b.

In FIG. 2a, an embodiment for the mask 18 is shown in top view. The opaque part 18a is drawn shaded, while the transparent one is unshaded. Merely exemplarily, the closed curve and the closed strip 18b, respectively, forms presently a rectangle and a square, respectively. As can be seen, the opaque part 18a of the mask is separated by the transparent part 18b into an outer part 18a1 surrounding the region 18b and an inner part 18a2 surrounded by the region 18b.

Figure 1B:
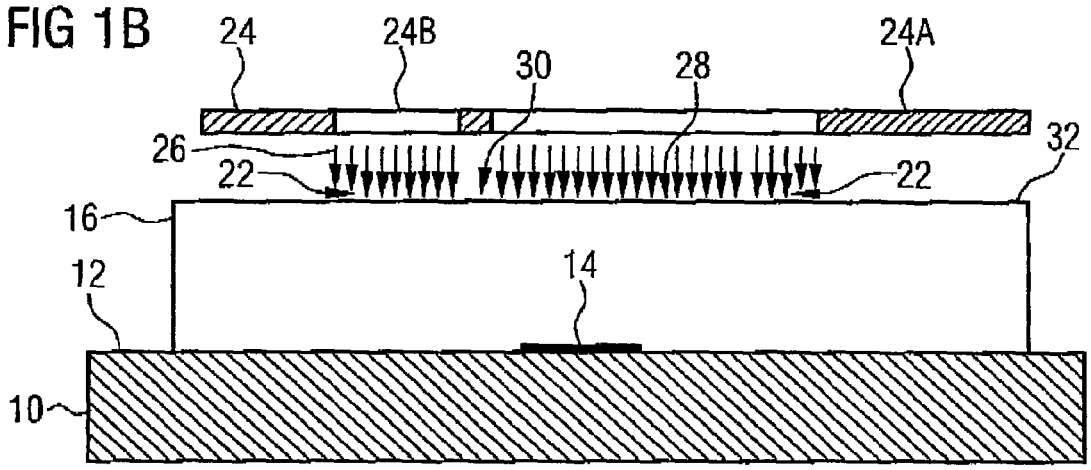

After the above-mentioned exposure of FIG. 1a, a further exposure takes place, which is illustrated in FIG. 1b. The exposure of FIG. 1b is performed with a second mask 24. The mask 24 serves for selectively exposing the negative resist of the layer 16 only at locations in the frame region 22 and in the region enclosed by the frame region 22, namely in the region 28 referred to below as cap region. Additionally, the mask 24 blocks the exposure light 26 at a section 30 within the cap region 28 which is referred to below as opening region 28.

In FIG. 1b, the opaque part of the mask 24 is indicated by 24a and the transparent one with 24b. FIG. 2b shows the second mask 24 in top view. As can be seen, the opaque part 24a falls into two parts, namely an outer part 24a1 surrounding the transparent part 24b and an inner part 24a2 surrounded by the same. In the embodiment of FIGS. 2a and 2b, the outer periphery of the transparent part 24b is congruent with the outer periphery of the transparent part 18b of the first mask. In the two exposure steps 1a and 1b, these two masks are adjusted such that these peripheral lines are equally aligned to the resist layer 16 in the subsequent exposure steps of FIGS. 1a and 1b. Since the periphery region 22 has already been exposed in the step of FIG. 1a, it should be noted that the transparent part of the second mask could also be smaller, but has to be at least the same size as the opaque inner part 18a2 of the first mask. In this case, in the two exposure steps of FIGS. 1a and 1b, the two masks 18 and 24 are adjusted such to the masks 18 and 24 that the outer periphery of the transparent part 24b of the second mask is fully in the periphery region 22 defined by the first mask.

The exposure of FIG. 1b serves for preparing the cap of the desired photo-resist material structure. In this exposure step, accordingly, the exposure dose is chosen smaller than in the step of FIG. 1a. Therefore, compared to the exposure of FIG. 1a, for example, the exposure time is reduced, the exposure intensity is reduced or the transparency of the transparent region 24b of the mask 24 is reduced relative to the one of the regions 18a in the first mask. The exposure dose in the step of FIG. 1b is chosen so small that the negative resist layer 16 does not cross-link across the full layer thickness but only to a certain desired cap thickness starting from the exposed side 32 of the resist layer 16.

Figure 1C:
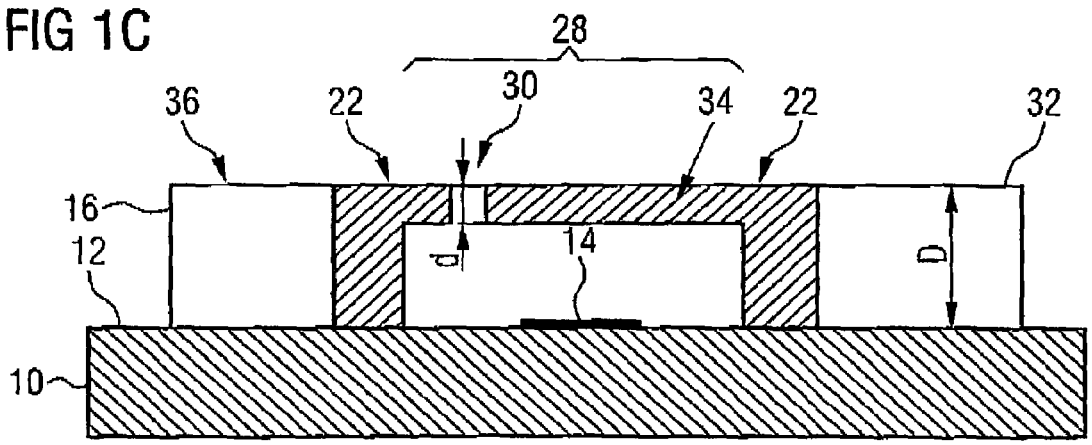

The result of the two exposure steps of FIGS. 1a and 1b is shown in FIG. 1c. There, those areas are shown shaded from top right to bottom left within the negative resist layer 16, which are sufficiently exposed by the exposure processes in FIGS. 1a and 1b, to remain in the subsequent developing and not to be dissolved. FIG. 2c shows the top view of the exposed side 32 of the resist layer 16 after the steps of FIGS. 1a and 1b to indicate which lateral regions of the layer 16 have experienced which dose. Additionally, the cross-section I-I is indicated in FIG. 2c, along which the intersection of FIG. 1c runs.

As can be seen from FIG. 2c, the layer 16 can be divided into four regions depending on the received dose. The opening region 30 is unexposed. Thus, the negative resist in this region 30 will be fully dissolved across the whole layer thickness in the developing step. The remaining region of the cap region 28 has been exposed with a dose which is sufficient to cross-link and expose, respectively, the photo-resist of the layer 16 from the exposed side 32 of the layer 16 up to a depth d, the later cap thickness. In the frame region 22, the negative resist of the layer 16 has been cross-linked across the full layer thickness D. In the side view of FIG. 1c, thus the shaded region 34 results.

According to the present embodiment, the region outside the frame region 22, which is indicated with 36 in FIGS. 1c and 2c, has also remained unexposed, as well as the opening region 30. Although this is not required for generating the later desired cavity around the micromechanical structure 14, non-exposing of region 36 enables that later during developing the negative resist, pads can be exposed on the surface 12 of the substrate 10, wherein these pads, however, are not shown for clarity. These pads can, for example, serve for directly contacting the micromechanical structure 34 or for indirectly controlling the same.

After the two exposing steps of FIGS. 1a and 1b, the photo-resist layer 16 is developed, whereby the unexposed parts of the negative resist layer 16 are removed and merely the exposed parts remain on the substrate 10. Thus, they form a photo-resist material structure around the micromechanical structure 14. More particularly, the structure 34 forms a cavity 38, which separates the structure 34 from the micromechanical structure 14, so that the same is not disturbed in its mechanical characteristics. Particularly, the structure 34 consists of a frame 40 resting on the surface 12, which projects from the surface 12 and laterally surrounds the micromechanical structure 14, and a cap 42 which, starting from the free end of the frame 40, spans the micromechanical structure 14 by keeping a distance and has an opening 44 in the opening region.

The developing step of FIG. 1d can be performed in any appropriate way. In any case, the opening 44 serves for removing the unexposed resist from the cavity 38. The unexposed resist can be removed, for example, via a developer liquid, which is sprayed on the resist surface 32 and simply dropped on up to the full covering of the surface 32, and then flushed, for example, with water or isopropanol, the latter being spun off by centrifuging.

For completing the housing for the micromechanical structure, the opening 44 is closed and covered, respectively, after the developing step. According to the present embodiment, a further negative resist layer of the thickness d2, which is larger than the layer thickness d of the layer 16, is deposited as a closure on the surface 12 of the substrate 10 and at least the region 44 and the region around it, in the present case even a bit beyond the frame region 22, is exposed in order to expose and cross-link, respectively, the same across the whole layer thickness $D_2$. After subsequent developing of this second negative resist layer, this procedure results in a sealing layer 46, as illustrated in FIG. 1b, which surrounds the opening 44 and above that the whole exposed surface of the structure 34 to rest on the surface 12. However, the closure does not have to project across the structure. It could also form only a plug in the remaining opening or openings 44, if several are provided.

The material for the sealing layer 46 can, for example, be the same material as the one used for the structure 34, such as SU-8. In addition to that, other materials can be used. The closure of the holes in the cap region can, for example, be performed with any polymer, wherein, however, photo-sensitive polymers are preferred which can also be resistant to the environment. In order to avoid that the polymer does not flow into the cavity 38 during the deposition, the polymer characteristics should be chosen such that the viscosity of the polymer during the deposition, i.e. in the non-cured state, has a viscosity of more than 2000 cST. For example, SU-8 with sufficiently high viscosity can be used, such as SU-8 50 with 1225 cST.

The result of the production method described above with reference to FIGS. 1a-1e and shown in FIG. 1e is therefore an apparatus for housing the micromechanical structure 14. Apart from the substrate 10, it comprises a structure 34 formed of a negative resist layer 16 with a closed frame 40, a cap 42 and an opening 44 in the cap, wherein the cavity 38 is enclosed in the same by the layer 46. In the case that the substrate 12 has, for example, been a wafer, a structure as shown in FIG. 1e is formed at many parts of the wafer simultaneously in the illustrated method steps. By subsequent dicing of the wafer, chips with an on-chip cavity and a micromechanical structure in the same are obtained. These can then, for example, be finished or sealed by molding and casting, respectively.

A further embodiment for producing an apparatus for housing a micromechanical structure is discussed below with reference to FIGS. 3a and 3b. This embodiment differs from that of FIGS. 1a-1e in that instead of a single negative resist layer a two-layer structure and a sandwich 16, respectively, of two negative resist layers 16a and 16b is used, one of which consists of a less and the other of a more sensitive negative resist. In contrast to the method according to FIGS. 1a-1e, first the negative resist layer 16b of less sensitive negative resist and then the second negative resist layer 16a of the more sensitive negative resist is deposited after providing the substrate 10, so that the second negative resist layer 16b lies between the negative resist layer 16a and the substrate 10.

According to the present invention, a resist is "less sensitive" than another when it has a lower resist sensitivity. The resist sensitivity is a measure of how high the dose has to be to obtain a corresponding photochemical transformation, such as cross-linking in the case of negative resist or bleaching in the case of positive resist.

Figure 3A:
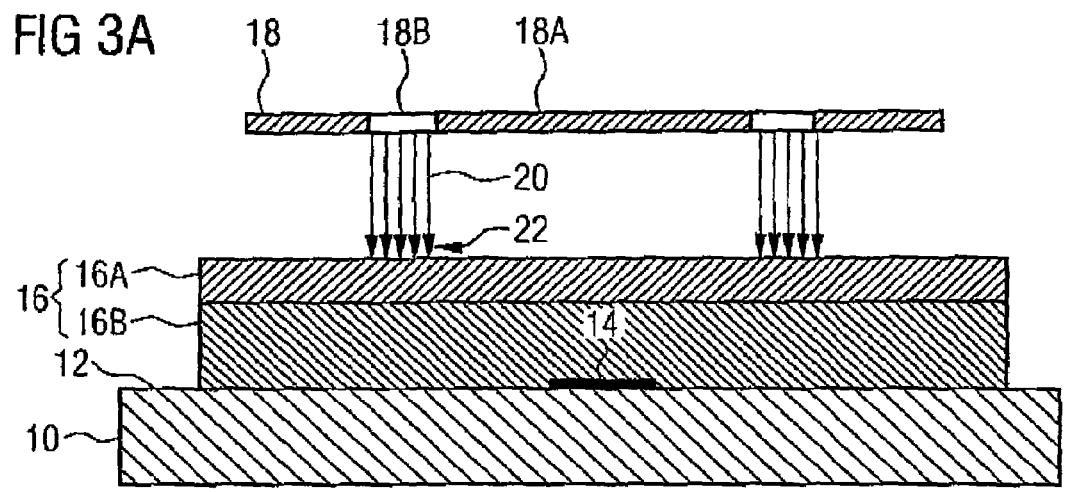
FIG. 3a-c are schematical sectional views as they result during the production of an apparatus for housing a micromechanical structure according to a further embodiment of the present invention to illustrate the individual method steps and the states resulting after the individual method steps, respectively.
Figure 3B:
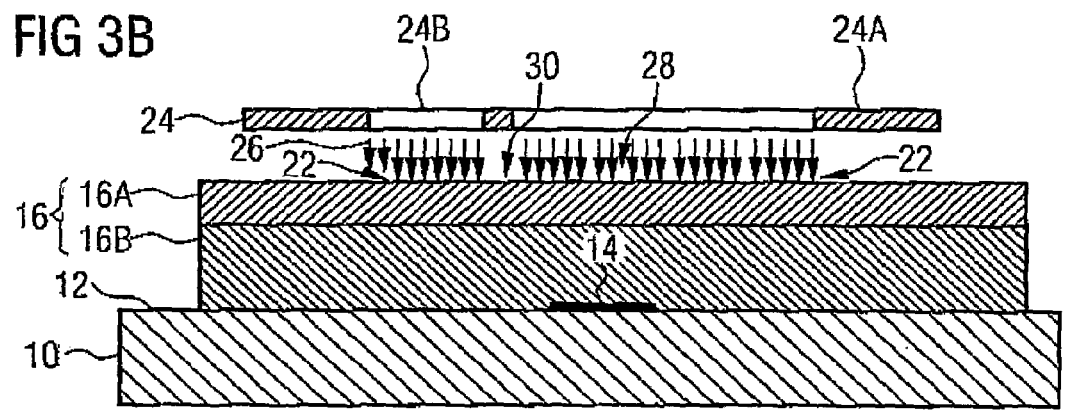
Figure 3C:
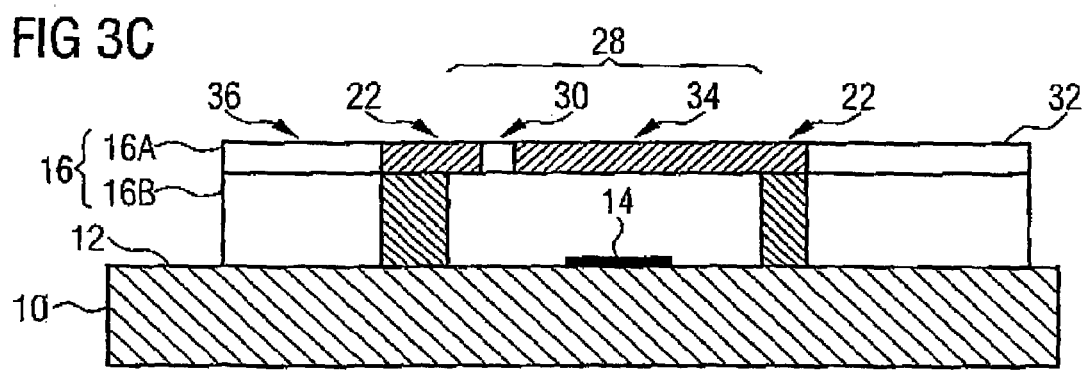

Apart from this alteration, the method of FIGS. 3a-3c corresponds to the method of FIGS. 1a-1e, wherein FIG. 3b corresponds to the method step of FIG. 1b and FIG. 3c to the stage of FIG. 1c.

In the embodiment of FIGS. 3a-3c, the layer thickness of the upper negative resist layer 16a is adjusted approximately to the desired layer thickness of the later cap layer and the later cap, respectively, or exactly to a value which lies somewhat below the desired layer thickness. The advantage of the procedure according to FIGS. 3a-3c is that, on the one hand, due to the higher resist sensitivity of the upper negative resist layer 16a in the second exposure, as illustrated in FIG. 3b, the minimum exposure dose required to fully polymerize and to cross-link, respectively, the upper negative resist layer 16a is very small. On the other hand, due to the lower resist sensitivity of the negative resist layer 16b lying below, the exposure dose required to fully cross-link the lower photo resist layer 16b is very high, in particular since this layer is covered by the very sensitive and highly absorbing layer 16a. Thus, a very large range of exposure dose values results, which lead to the fact that the double layer 16 does not cross-link across its whole thickness, i.e. the thickness of the layer 16a plus the thickness of the layer 16b but at least across the whole thickness of the partial layer 16a. In other words, the process window for the exposure dose of the cap layer is thereby extended compared to the embodiment of FIGS. 1a-1e.

A further alternative to the method of FIGS. 1a-1e is discussed below with reference to FIGS. 4a-4b. According to this alternative, the two exposure steps of FIGS. 1a and 1b are integrated into one exposure step. This is obtained by using a mask 50, which differs from the mask 18 of FIG. 1a in that it has a no fully opaque effect in the inner opaque part 18a but only a light-attenuating effect, with the exception of the part of the mask corresponding to the opening region, which remains opaque. Accordingly, the mask 50 comprises an opaque part 50a, a transparent part 50b and a semitransparent part 50c, which has a higher absorption coefficient at the exposure wave length than part 50a.

Figure 5:
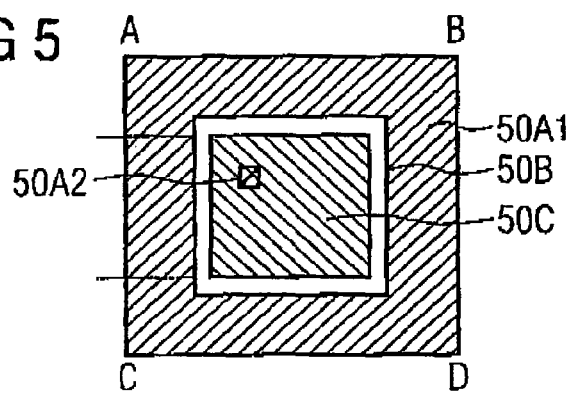

A top view of the mask 50 is shown in FIG. 5. In FIG. 5, the opaque part is shaded from top right to bottom left and the semitransparent part 50c is shaded from top left to bottom right. As can be seen, the opaque part is seperated into an outer opaque part 50a1, which corresponds to the opaque part 18a1 of the first mask of the method of FIGS. 1a-1e, and a second inner opaque part 50a2, which corresponds to the inner opaque part 24a2 of the second mask of the method of FIGS. 1a-1e. The transparent part 50b corresponds to the transparent part 18b of the first mask of the method of FIGS. 1a-1e. The semitransparent part 50c corresponds in area to the part 24b of the second mask of the method of FIGS. 1a-1e.

Figure 4A:
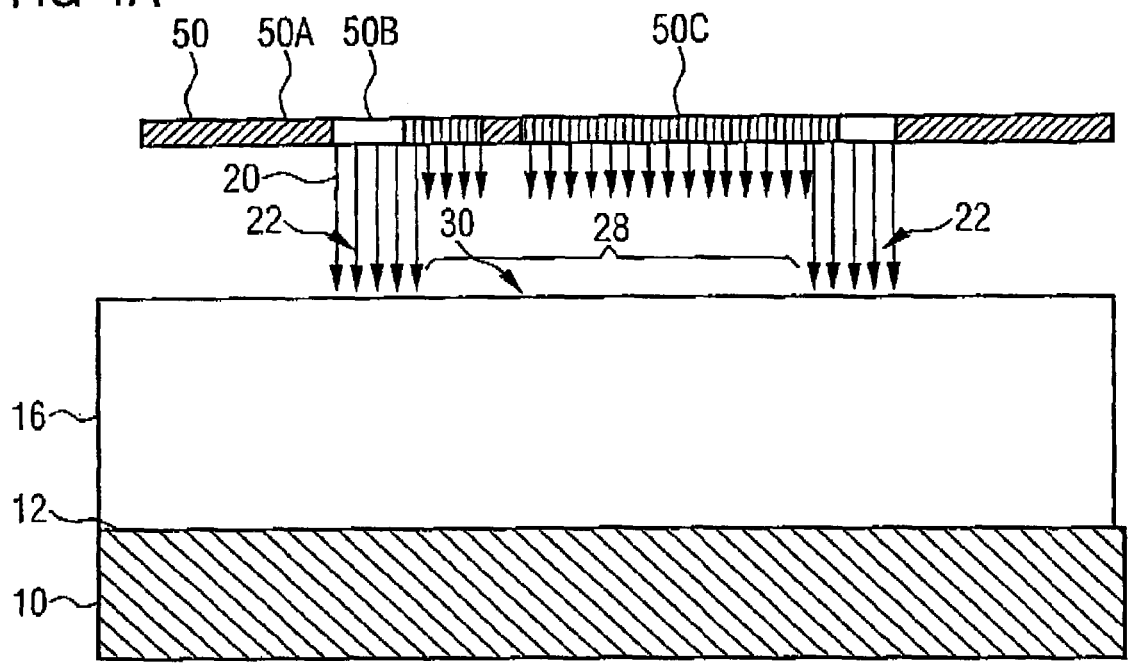
FIG. 4a,b are schematical sectional views as they result during the production of an apparatus for housing a micromechanical structure according to a further embodiment of the present invention to illustrate the individual method steps and the states resulting after the individual method steps, respectively.
Figure 4B:
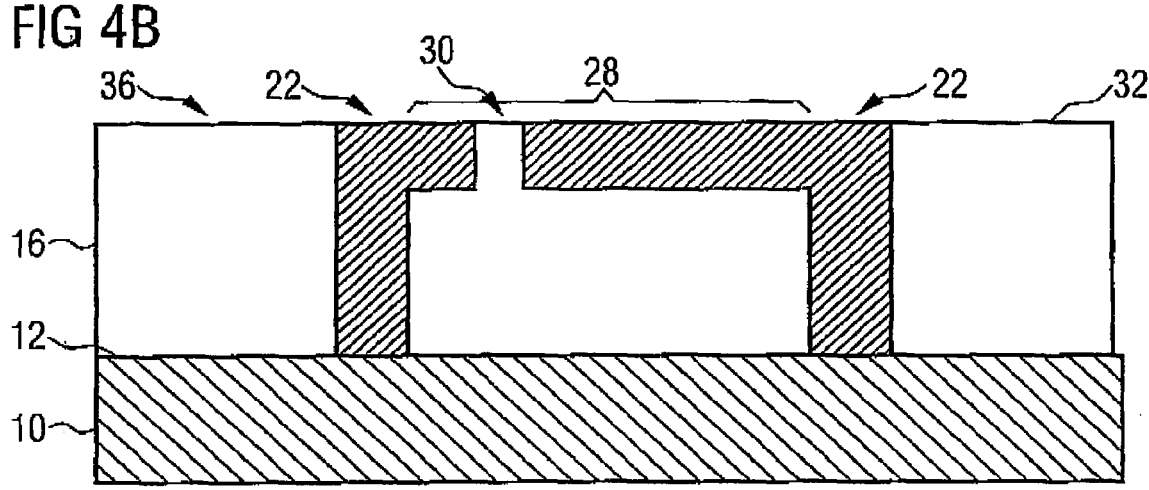

In the embodiment of FIGS. 4a-4b, the transparency of the region 50c as well as the exposure dose in the exposure in FIG. 4a are to be chosen such that, on the one hand, the exposure dose in the frame region 22 is sufficient to fully cross-link the negative resist in the layer 16 and, on the other hand, the same is attenuated in the cap region 28, such that it leads from the surface 32 only to the desired layer thickness of the cap for cross-linking the negative resist. The light dose of the exposure light 22 in the regions 28 and 50c, respectively, which is lower and attenuated, respectively, due to the light attenuation compared to the one in the other regions 22 is indicated in FIG. 4a by the arrows 20 with different lengths.

Apart from the integration of the two exposure steps, the embodiment of FIGS. 4a-4b corresponds to the method of FIGS. 1a-1e, wherein FIG. 4b corresponds to FIG. 1c. Consequently, according to the embodiment of FIGS. 4a-4b, the cavity 38 can be generated with one mask and one lithography step, respectively, less. In the attenuating part 50c, the mask 50 can, for example, consist of opaque material or a fine chrome lattice for reducing the dose.

FIGS. 6a-6b show method stages according to a further embodiment of the present invention corresponding to FIGS. 4a and 4b, which differs from the method of FIGS. 4a-4b in that instead of a one-layer negative resist layer a sandwich 16 of the negative resist layers 16a-16b is used as in the embodiment of FIGS. 3a-3c.

In the following, with reference to FIGS. 7a-9b, embodiments will be described, which refer to the production of an apparatus for housing a micromechanical structure, wherein the photo-resist material structure is not formed of a negative resist layer and a sandwich of negative resist layers, respectively, but rather of a sandwich of positive resist layers.

In contrast to negative resist, wherein during developing the unexposed parts are removed and only the exposed resist parts remain, positive resist has the opposite characteristic, that when the same is developed the exposed parts are removed and the unexposed remain. Due to this fact, the procedure in the production is slightly different than in the previous embodiments. The following embodiment with positive resist relates to a two-layer system and a sandwich arrangement, respectively, as it was also the case in the embodiments of FIGS. 3a-3c and 6a-6b.

The embodiment of FIGS. 7a-7e begins like the previous embodiments with negative resist as well, with the provision of the substrate 10 which has the micromechanical structure 14 on its main side. Then, first, a first positive resist layer 116b and then a second positive resist layer 116a are deposited on the surface 12 of the substrate 10. The deposition of the positive resist layers can be performed as described with reference to FIG. 1a with regard to negative resist layers. Merely the deposited material differs from the previous embodiments in that it has positive resist characteristics.

The two positive resist layers 116a and 116b have different resist sensitivities. The upper positive resist layer 116a has a lower resist sensitivity than the positive resist layer 116b covered by the same. The reason for this selection of resist sensitivity ratios will become clear from the following description, particularly with regard to the second exposure step of FIG. 7b.

After the deposition of the positive resist layers 116a-116b the first exposure step is performed. The first exposure step is performed via a first mask 118, which has opaque portions 118a and transparent portions 118b, such that an exposure via the exposure light 20 only takes place laterally at the opening region 30 and the outer region 36 and the exposure light is blocked at the other lateral parts. A top view of the first mask 118 is illustrated in FIG. 8a. Particularly, the opaque region 118a is illustrated shaded, while unshaded areas are transparent. As can be seen, the transparent region is divided into two parts, namely an outer part 118b1 surrounding the region 118a and an inner part 118b2 surrounded by the opaque region 118b. As will be shown later, the extension of the opaque region 118a corresponds to the size of the cap region 28 and the wall region 22 taken together.

The exposure wavelength is again chosen such that the positive resist of layers 116a and 116b reacts photo-sensitively on this wavelength, so that it is subsequently removable by a developer.

The exposure dose in the first exposure step of FIG. 7a is chosen sufficiently high so that both the first photo-resist layer 116a and the lower photo-resist layer 116b are sufficiently exposed across their whole thickness at the exposed regions 30 and 36, so that they are fully removed at these locations across the whole thickness during developing.

FIG. 7b shows the second exposure step which follows the first exposure step of FIG. 7a. The second exposure step of FIG. 7b is performed via a second mask 124. The second mask comprises an opaque part 124a and a transparent part 124b such that the exposure light 126 in the exposure of FIG.

7b impinges only in the cap region 28 on the exposed surface 36 of the upper positive resist layer 166a.

In this exposure process, the exposure dose is chosen lower than in the first exposure step of FIG. 7a. On the one hand, the exposure time is chosen shorter than the exposure time required to expose the upper positive resist layer 116a in its full thickness and to bleach it, respectively. The exposure time required therefore is also relatively high, since the upper positive resist layer 116a has a lower resist sensitivity relative to the lower positive resist layer 116b. Consequently, the exposure dose can still be chosen relatively high in the exposure step of FIG. 7b, without bleaching through the upper positive resist layer 116a. Additionally, since the upper positive resist layer 116a has a lower resist sensitivity, only little light from the incident exposure light 126 is absorbed by the upper positive resist layer 116a, so that during the exposure time starting from the beginning a high portion of the incident exposure light penetrates the lower positive resist layer 116b covered by the upper positive resist layer 116a. This lower positive resist layer 116b does now have a relatively higher resist sensitivity, so that a relatively low exposure dose at the interface between the positive resist layers 116a-116b is sufficient to bleach the lower positive resist layer 116b across its full thickness. As a whole, it is thus possible to set the exposure dose such that, on the one hand, the upper photo-resist layer 116a is not transformed across its whole thickness but the actually covered positive resist layer 166b lying below it is transformed across its whole thickness. The higher the difference of the sensitivities of the layers, the larger the process window for the exposure dose of the cap layer to be generated by the exposure step of FIG. 7b.

FIG. 8b shows a top view of the second mask 124, wherein again the opaque part 124a is shaded and the transparent part 124b is unshaded. The opaque part 124b extends laterally across an area corresponding to the cap region 28.

FIG. 7c shows the state resulting after the two exposure steps of FIGS. 7a and 7b. In FIG. 7c, the unexposed part of the positive resist layer sandwich 116 is illustrated shaded from top right to bottom left and with the reference number 134. As can be seen, the positive resist sandwich 116 is unexposed across the whole thickness in the frame region and wall region 22, respectively, which fully encircles the micromechanical structure 14 laterally. In the cap region 28, the photo-resist double layer 116 is merely unexposed in the upper part, which corresponds in height to about the thickness of the upper photo-resist layer 116a. Below that, the positive resist is exposed in the cap region 28 up to the surface 12 of the substrate 10. Merely in the opening region 30, the exposed part of the positive resist extends in the double layer 116 across the whole thickness from the surface 12 of the substrate 10 towards the exposed side 32.

Figure 7D:
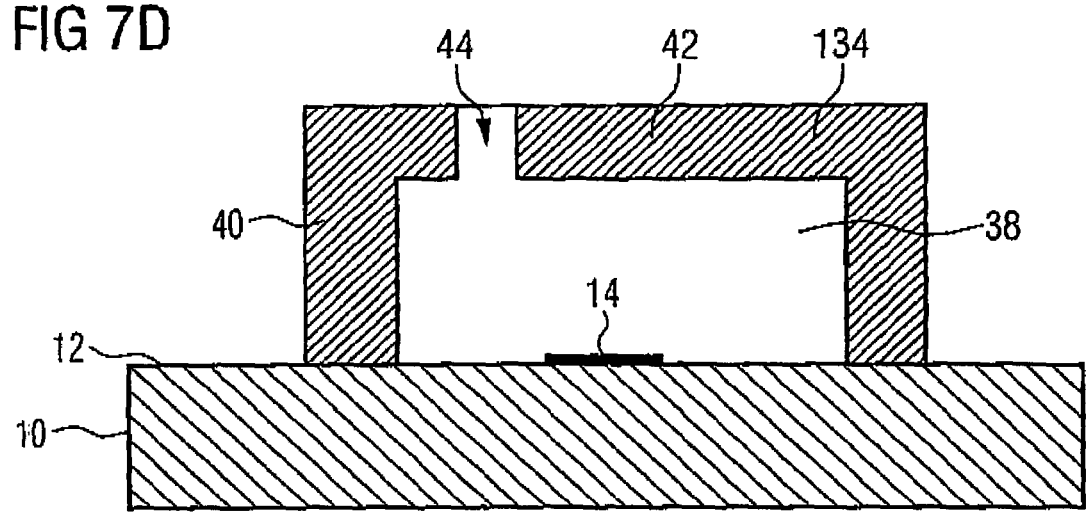
Figure 7E:
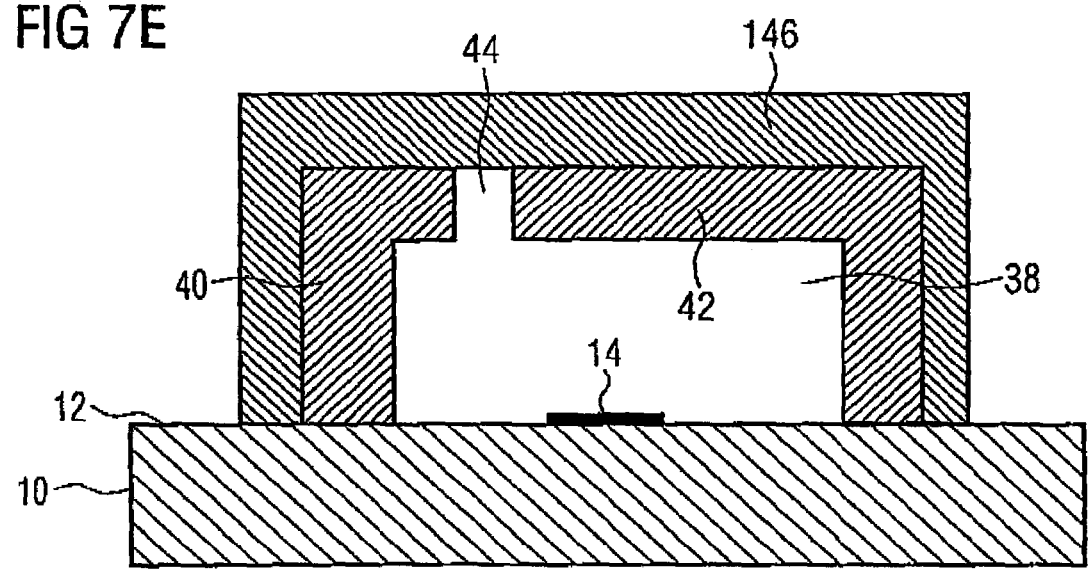

The further method steps of FIGS. 7d and 7e correspond mainly to the method steps of FIGS. 1d and 1e. In the method step following the two exposure steps of FIGS. 7a and 7b the developing of the positive resist takes place, such as by the above-described deposition of a suitable developer with subsequent flushing of the developer with water or other solvents, such as isopropanol, and removing the same by centrifuging.

The resulting photo-resist material structure 134 corresponds in its shape to the one of FIG. 1c and in its structure to the one of FIG. 3c, i.e. it is also made up of two photo-resist layer with the difference that the structure 134 of FIG. 7d consists of positive resist.

In the subsequent method step, a layer 146 covering the opening 44 in the cap 42 is deposited, which can, for example, also consist of positive resist.

Just as the embodiment of FIGS. 3a-3c could be varied with regard to integrating exposure steps, the embodiment of FIGS. 7a-7e can also be varied in that the two exposure steps of FIGS. 7a and 7b can be replaced by a single exposure step via a single mask 150. The mask 150 comprises an opaque part 150a, a transparent part 150b and a semitransparent part 150c, which has a higher absorption compared to the transparent part 150b. The mask of FIG. 9a corresponds mainly to the inverse of the mask of FIG. 4a. In other words, starting from the mask of FIG. 4a, the mask of FIG. 9a is obtained when the opaque parts and the transparent parts are interchanged.

Figure 9A:
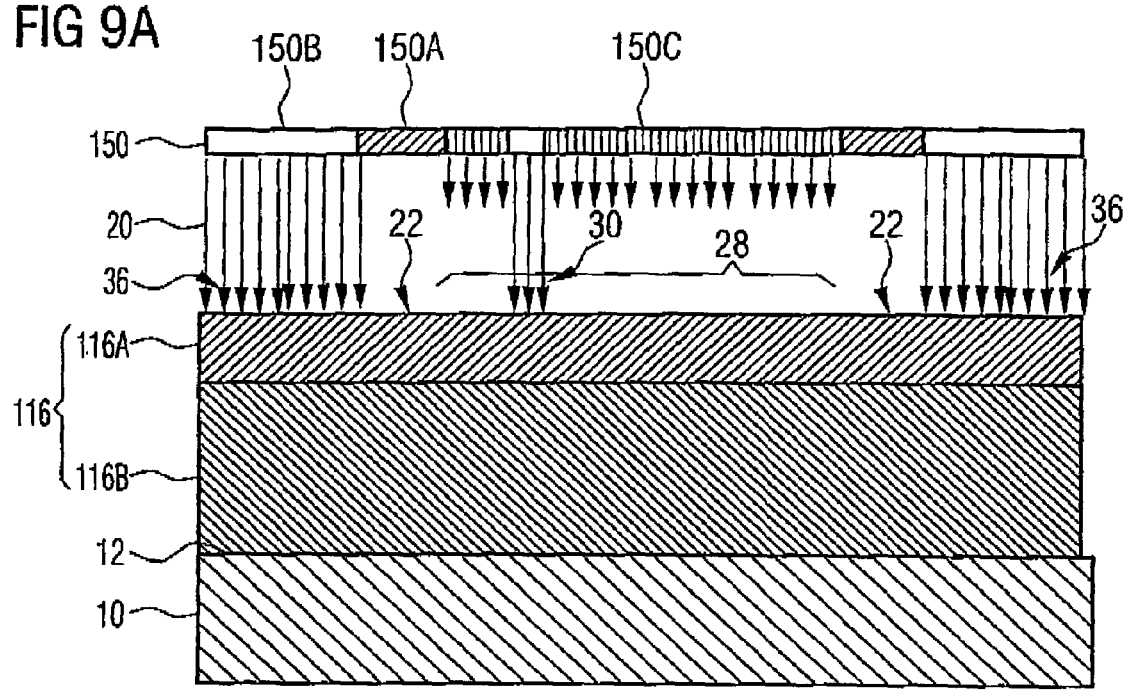
FIG. 9a,b are schematical sectional views as they result during the production of an apparatus for housing a micromechanical structure according to a further embodiment of the present invention; and to illustrate the individual method steps and the states resulting after the individual method steps, respectively.
Figure 9B:
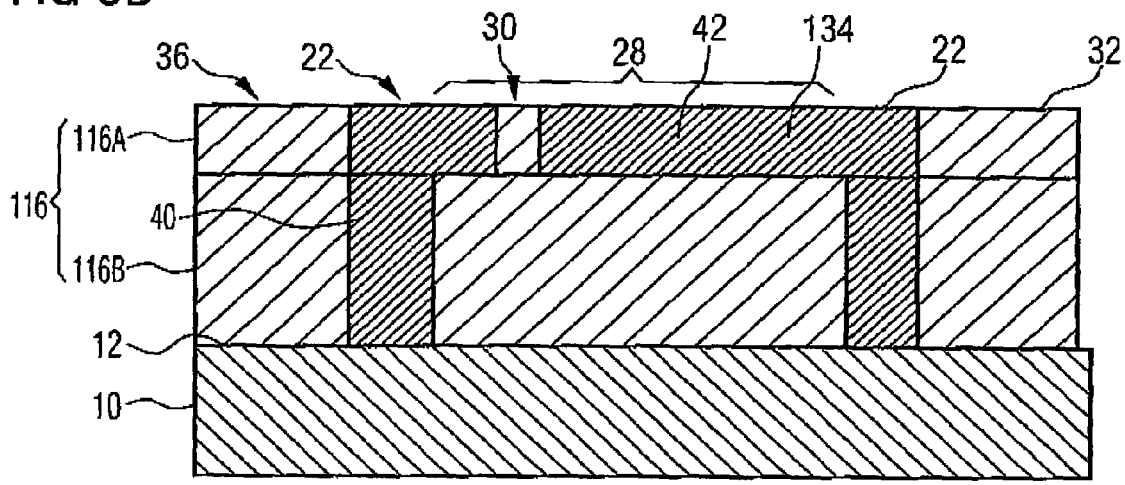

As shown in FIG. 9b, which shows the state after the exposure of FIG. 9a, the form of the exposed part of the positive resist of the double layer 116 corresponds to the one resulting from the embodiment of FIGS. 7a-7e, which is why the subsequent method steps according to the embodiment of FIGS. 9a-9b are also identical to the ones of the previous embodiment of FIGS. 7a-7e.

In the previous embodiments, the generation of a cavity either in the negative resist or positive resist has been obtained by using different doses of the same wavelength on different lateral regions. The process window for setting the doses, particularly the dose for generating the cap, could be increased with negative resist in that a sandwich structure of varyingly sensitive resist layers has been used. According to the subsequent embodiment, the process window is extended by using a different spectral region in the exposure for the cap of the photo-resist cavity structure to be generated than in the continuous crosslinking of the frame structure, namely a spectral range or a spectral wavelength where the photo-resist, here a negative resist, is more sensitive and has a higher absorption, respectively, than in a spectral range and a wavelength, respectively, which is used for exposing the frame region where the negative resist is to cross-link fully across the whole thickness, so that for the last-mentioned exposure a too high absorption would be disadvantageous.

The production method of FIGS. 10a-e begins, like the method of FIGS. 1a-e as well, with the provision of a substrate 10 at the main side 12 of which a micromechanical structure 14 is provided, and whereon a negative resist layer 16 is deposited, which is again exemplarily assumed to consist of SU-8 negative resist material. Thereupon, an exposure is performed via a mask 18, which has opaque parts 18a and transparent parts 18b such that it lets incident exposure light 20 impinge laterally only at a frame region 22 on the negative resist 16. Exposure wavelength and exposure dose are chosen like in the embodiment of FIG. 1a such that the negative resist is cross-linked across the whole layer thickness. The exposure can, for example, be performed with a wavelength of 365 nm or in a spectral range, which extends from longer wavelengths up to 365 nm, wherein the reason for this range will become clear from the subsequently discussed graphs.

In a subsequent step, the exposure is performed for the cap with the opening. This method step is illustrated in FIG. 10b. The negative resist 16, which has already been exposed continuously at the frame region 22, is exposed via a mask 24 in this step, as it also used in step FIG. 1b, i.e. a mask 24 which has opaque parts 24a and transparent parts 24b disposed laterally such that exposure light 26 is laterally only transmitted in the cap region 28 and there, with the exception of the opening region 30, to impinge on the negative resist 16. In the present case, the mask 24 is additionally made such that the exposure light 26 also impinges on the frame region 22, although this is not absolutely required since the resist is already continuously cross-linked across the whole thickness.

Figure 10A:
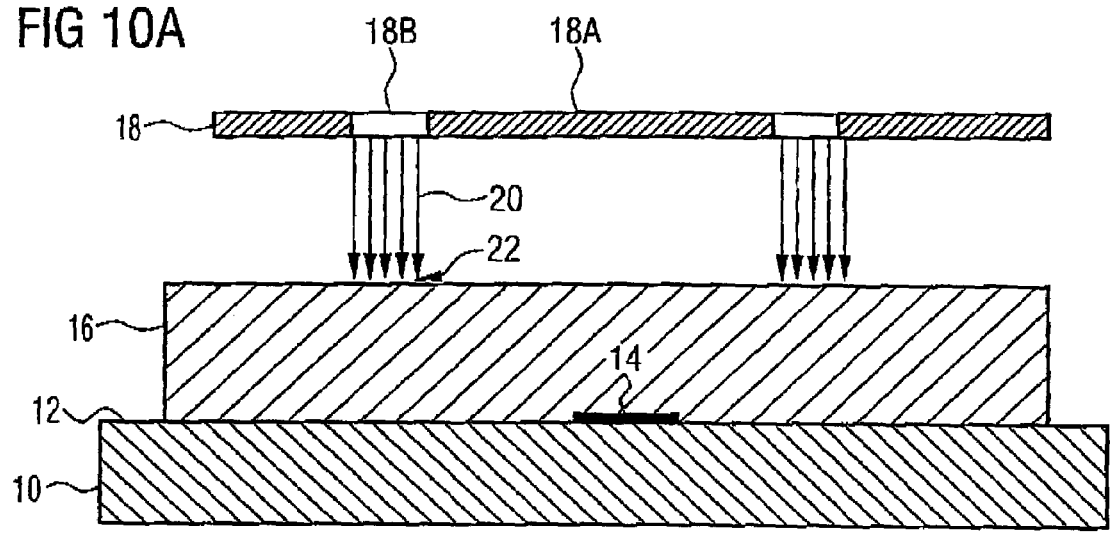
FIG. 10a-e are schematical sectional views as they result during the production of an apparatus for housing a micromechanical structure according to a further embodiment of the present invention; and to illustrate the individual method steps and the states resulting after the individual method steps, respectively.
Figure 10B:
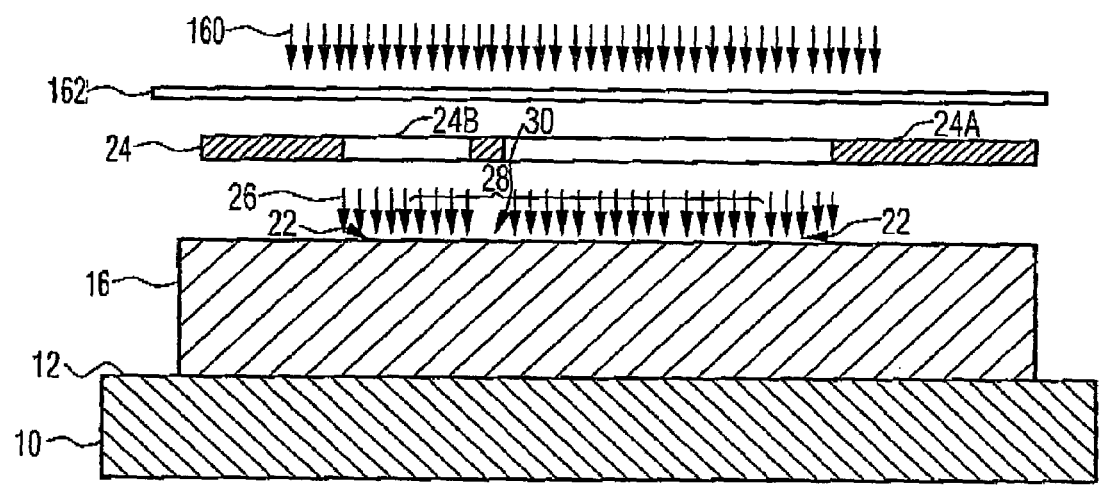

Light of a different wavelength than the exposure light 20 in the first exposure step of FIG. 10*a* is used as exposure light 26. More specifically, the spectrum of the exposure light 26 is chosen such that the negative resist of the negative resist layer 16 in the spectral range and the wavelength of the spectrum, respectively, has a significantly higher absorption and a higher sensitivity, respectively, than in the spectral range and the wavelength, respectively, of the exposure light 20 of the first exposure step. Preferably, in the spectral range of the second exposure of FIG. 10*b*, the negative resist has an absorption which is higher by the factor of 10 or more than in the spectral range of the first exposure of FIG. 10*a*. According to the present embodiment, the exposure light 26 which passes the mask 24 with the desired wavelength and the wavelength range, respectively, is produced by guiding broadband light 160 through an optical filter 162 with appropriate filter properties to transmit only light of the desired wavelength. The filter 162 is, for example, the filter UV 300 of Süs Microtec to obtain light with a wavelength of about 313-335 nm exposure light 26, wherein, for example, a mercury vapor lamp is used as light source. A scanning exposure via a laser beam is also possible, as well as the usage of different light source filter pairs or monochromatic laser light.

The effect of selecting the wavelength of the exposure in the step of FIG. 10*b* such that the absorption of the negative resist 16 for this wavelength is significantly larger than in the exposure of FIG. 10*a* is that thereby the process window for setting the exposure dose is greater and thus the thickness of the cross-link layer can be set more exactly within the negative resist layer 16. This will be discussed below with regard to FIGS. 11-12, wherein it is assumed that SU-8 is used as negative resist.

Figure 11:
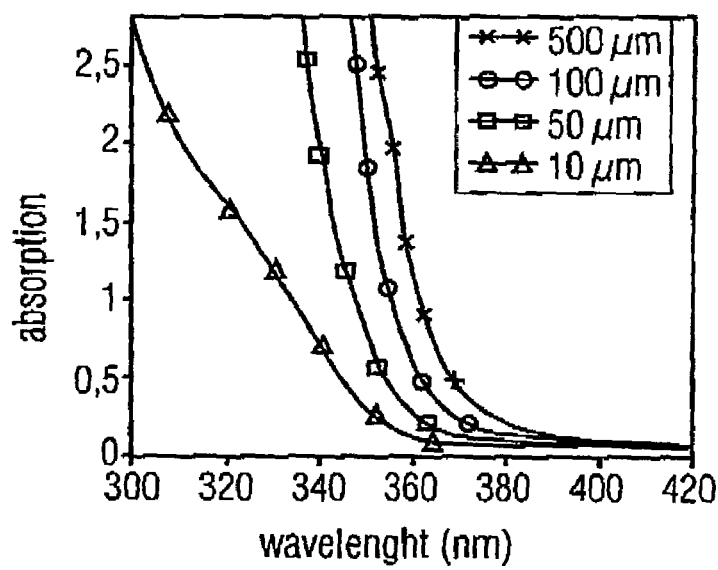
FIG. 11 is a graph wherein the absorption of light in SU-8 is plotted in dependence on the wave length for different penetration depths and for different layer thicknesses, respectively.

The absorption of SU-8 is plotted in FIG. 11 as a graph across the wavelength for different penetration depths and layer thicknesses, respectively. As can be seen, the absorption of SU-8 rises very strongly with shorter wavelengths than the I-line (365 nm) of a mercury vapor lamp. If light of a wavelength shorter than the I-line is used, the light in the upper resist layers of the negative resist layer 16 is absorbed so strongly that only the upper regions of the resist 16 are exposed. The thickness of this through-exposed area can be varied with otherwise equal conditions, such as constant exposure dose due to the dependence of the absorption on the exposure wavelength by the selection of an appropriate exposure wavelength or selecting an appropriate exposure wavelength range, such as an appropriate edge position of an edge filter, an appropriate bandpass filter or by selecting an appropriate laser light.

The setting of the cap thickness, which is generated, is also very insensitive against dose variations at high absorption. Thus, a large process window is obtained, since the thickness becomes insensitive against dose variations.

Figure 12:
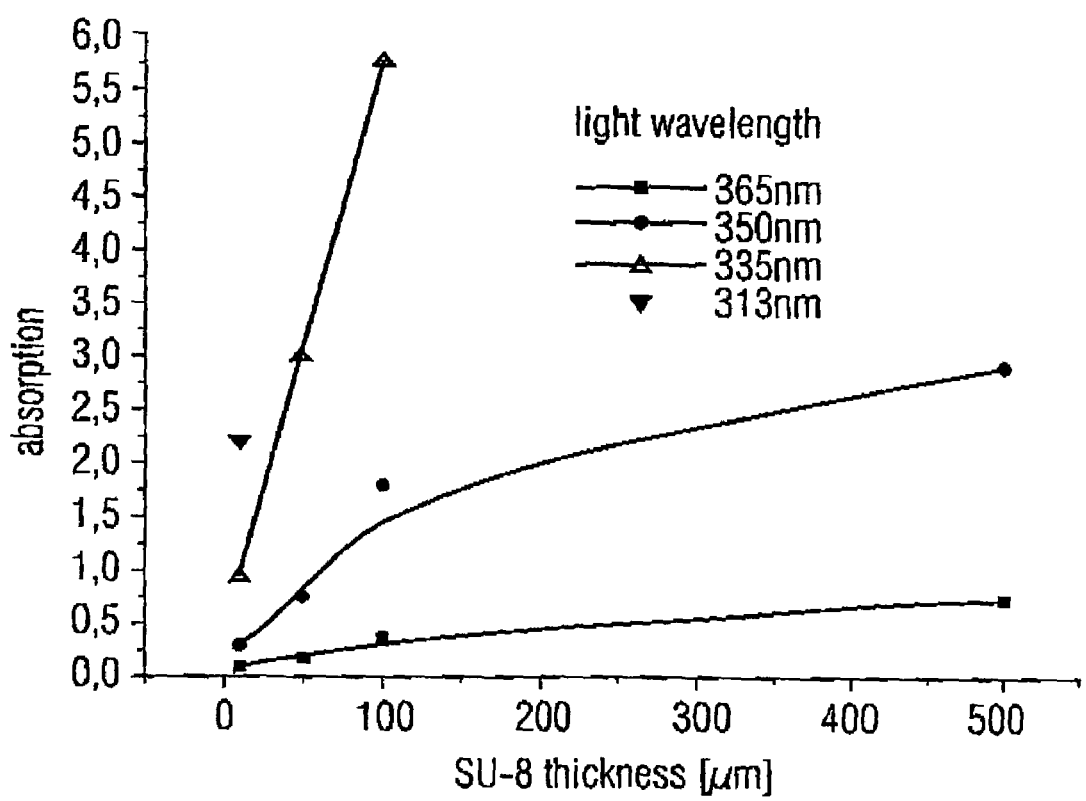
FIG. 12 is a graph wherein the absorption SU-8 is plotted in dependence on the SU-8 thickness for different light wave lengths.

FIG. 12 shows in one graph the absorption of SU-8 plotted across the penetration depth and SU-8 layer thickness for different light wavelengths, respectively, wherein the graphs are obtained by a least-square-fit by measurement points. As can be seen, the exposure dose has been weakened at 365 nm in a penetration depth of 100 nm by a 16 times lower absorption than in the case of using exposure light with the wavelength of 335 nm. This is the reason why the same exposure energy with different exposure wavelength results in different cross-link thicknesses. Accordingly, in the second exposure step, the penetration depth is reduced compared to the first exposure step, and thus also the exposed layer thickness.

The exposure dose is set in the second exposure step such that the appropriate layer thickness results at the selected wavelength.

Figure 10C:
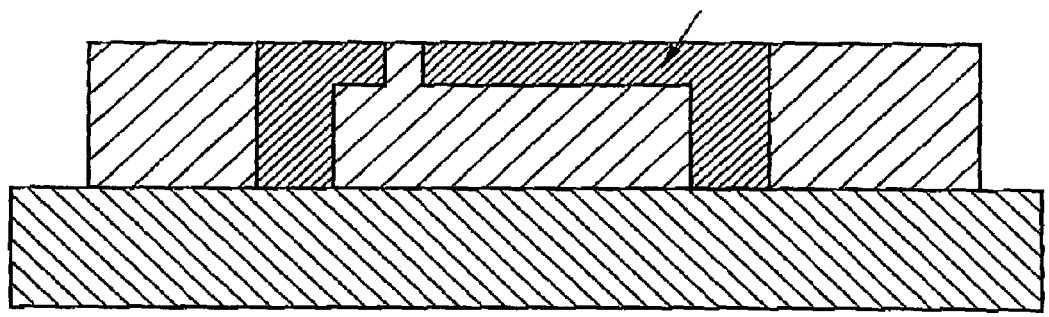
Figure 10D:
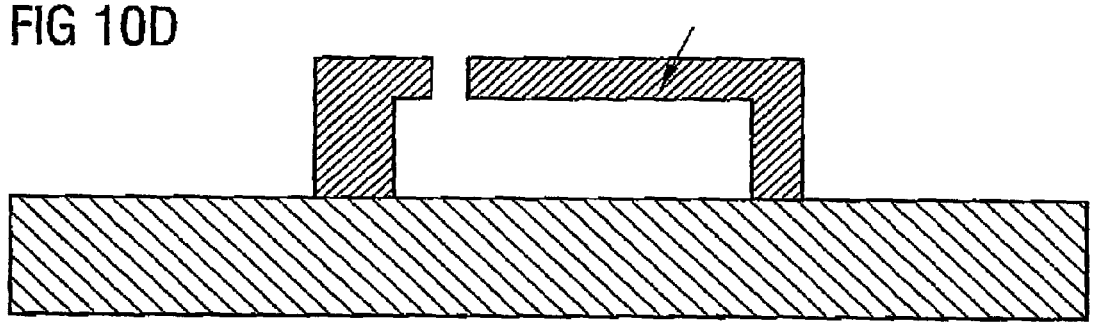
Figure 10E:
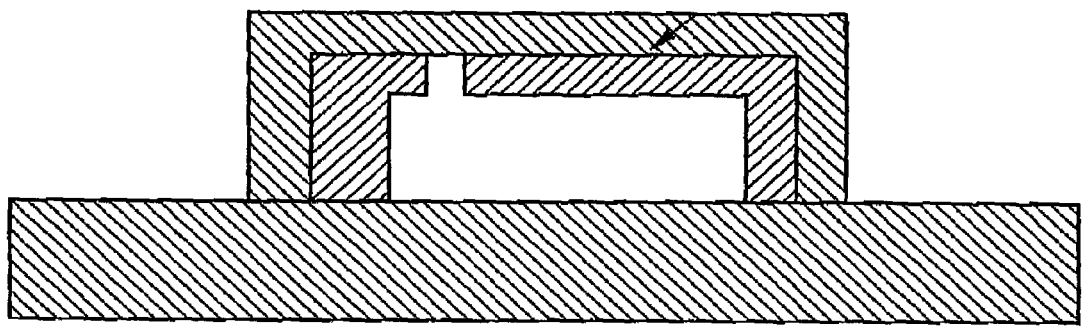

The arrangement of the exposed parts of the negative resist layer 16 as shown by the exposure steps 10*a* and 10*b* is shown in FIG. 10*c*. As can be seen, the arrangement corresponds to the arrangement of FIG. 1*c*. Accordingly, the production method of FIGS. 10*a*-10*e* corresponds also to the one of FIGS. 1*a*-1*e* in the further progress. This means that the resist of the negative resist layer 16 which has not been exposed is dissolved in a subsequent developing step, whereby the cavity 38 is generated, which is surrounded by the photo-resist cavity structure 34 as shown in FIG. 10*d*. Subsequently, closing of the cavity 38 is performed, wherein this is performed in the same way as in FIG. 1*e* in the present case of FIG. 10*e*, namely by depositing a further resist layer 46 of negative resist, exposure and subsequent developing.

Figure 13:
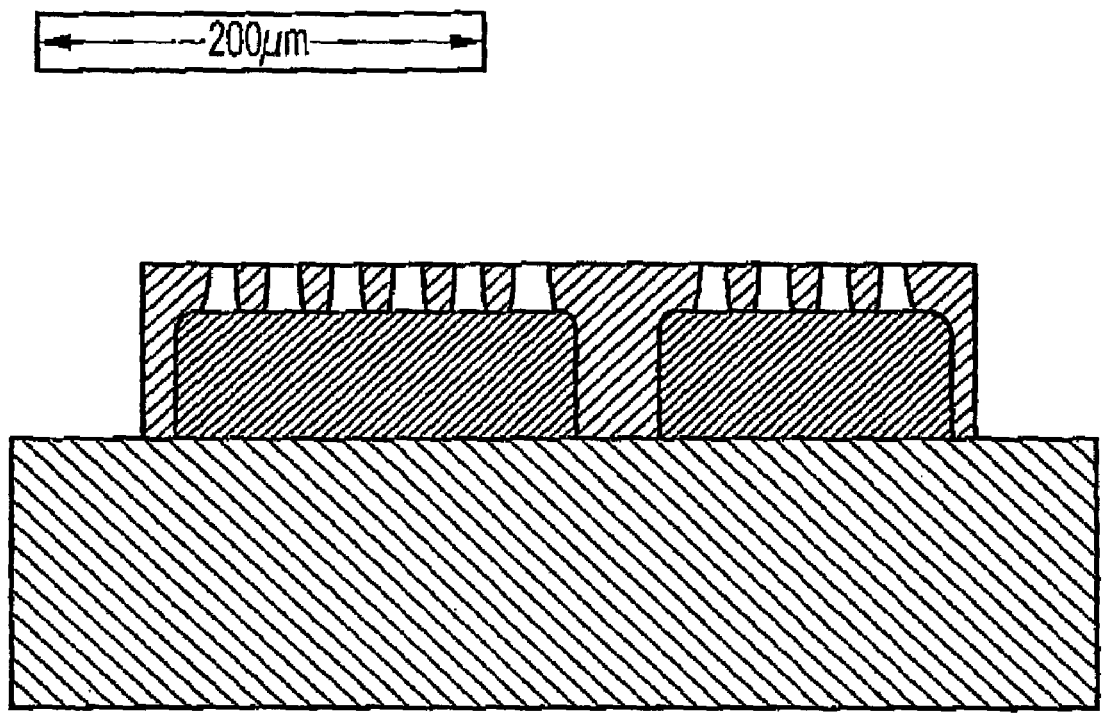
FIG. 13 is a photography of a cavity produced according to the method of FIGS. 10a-10e in a method stage according to FIG. 1d.

Finally, FIG. 13 shows a photography of a cross-section of a cavity generated by the steps of FIGS. 1*a*-1*d*, wherein in the second exposure step a mercury vapor lamp has been used in connection with a bandpass filter UV300 and SU-8 as negative resist. The dimensions are indicated in the upper left in FIG. 13.

Thus, the above-described embodiments enabled a technically less expensive and more cost-effective housing of a mechanical structure by depositing and structuring a photo-structurable resist on a substrate and wafer, respectively, and generating a cavity for devices, containing regions whose functions would be affected by a mould housing without a cavity, respectively. In the case of a negative resist, this resist has been structured according to an embodiment in two exposures with two different exposure doses and different masks. Thereby, a frame which encloses the structure to be protected was exposed with a first exposure and the whole residual thickness was exposed. In a directly following second exposure, the resist has been exposed with a second mask and a lower exposure dose across the device to be protected up to a thickness defined by the dose. This second exposure defined the ceiling of the cavity to be closed. The top was simultaneously provided with holes in the second exposure step. In the subsequent developing step, the unexposed resist below the ceiling has been dissolved through the holes in the ceiling. The holes in the ceiling were closed by a second resist layer to be structured.

According to an alternative embodiment, the first two exposure steps were integrated into one step by using a corresponding mask. The mask was not allowed to reduce the exposure dose in the frame region of the structure. In the whole top region, the dose has been attenuated accordingly, depending on the desired top thickness. There was not exposure in the area of the holes. Such a mask, namely like the mask 50 but also like the mask 150 could also be generated by opaque materials in the cap region or by a fine rasterisation of the metal layer of the mask.

According to a further embodiment, a photo-structurable negative resist has been exposed with a specific wavelength, and a specific wavelength range, here exemplarily an Hg vapor lamp with a specific filter. Thereby, the wavelength-dependent absorption of the resist was utilized. The absorption of SU-8 resist increases strongly with a shorter wavelength than the I-line. If only light with wavelengths shorter than the I-line is used, the light in the upper resist layers is absorbed so much that only the upper regions of the resist are exposed. The thickness of this through-exposed area can thus be varied by the selection of an appropriate wavelength or wavelength range and becomes thus insensitive against dose variations. Thus, a large process window is obtained, since the thickness becomes insensitive against overexposure. If according to this procedure a 100 µm thick SU-8 layer is exposed with 335 nm instead of 365 nm, an absorption increased by a factor of 16 is obtained. The penetration depth is reduced accordingly and thus the exposed layer thickness. With a first mask with a dose 1 which is sufficient to expose the whole resist layer, a frame is exposed. In a second exposure, the cap area is exposed with a dose 2. Thereby, light of a wavelength or wavelength range is used where the resist absorbs strongly. Unexposed parts are in the cap region, which form holes in the cap. During the development of the resist, the unexposed resist is dissolved and a cavity results. With a second resist layer and a $3^{rd}$ exposure with subsequent developing, the holes in the cap are closed and contact pads are opened.

Further, embodiments have been described by using positive resist. Here, a two-layer system was used. Insensitive resist was disposed above more sensitive resist. Exposed positive resist was removed during developing.

All embodiments can also be used for generating and housing, respectively, free-swinging plates, centrifugal mass or the like.

In the following, reference will be made to different variation possibilities of the previous embodiments. For example, the above-described shape of the frame of the photo-resist material structure, which was square in top view, was merely exemplarily and can thus have any other form with a closed curve on the surface 12. Further, the position and the number of the opening and openings, respectively, in the cap and the cap layer, respectively, can be varied. Further, it should be noted that although exposure steps have been mentioned above, further any radiation apart from light could be used, such as α radiation. The above-provided examples for closures of the opening in the photo-resist material structure, which provided a photo-resist layer can also be altered arbitrarily. Particularly, it would be generally possible to close the opening by molds with an appropriate casting material with the suitable material characteristics, particularly with sufficiently high viscosity and to thereby close the whole surface 12 at the same time.

Further, it should be noted that the embodiment of FIGS. 10a-10e could of course also be performed in connection with a double structure and sandwich structure, respectively, and/or with only one mask. The single mask could be structured laterally like the mask of FIG. 5, namely with a region 50a1, 50a2 which does not transmit and blocks, respectively, a broadband incident light laterally selectively, namely particularly at the opening region, a region 50b which only transmits light in a first spectral range, namely for the continuous cross-linking in the frame region, and a region 50c, which transmits light only in a second spectral range, namely for the partial cross-linking in the cap region except the opening region. The dose ratio for the exposed regions could be set via the ratio of the filter strengths at the transparent regions 50b, 50c with different filter function.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for producing an apparatus for housing a micromechanical structure, comprising the steps of:
   a) providing a substrate having a main side on which the micromechanical structure is formed;
   b) depositing a first and a second photo-resist layer on the main side such that the second photo-resist layer is formed between the first photo-resist layer and the substrate, wherein the first photo-resist layer is formed of a first photo-resist material and the second photo-resist layer of a second photo-resist material, the first photo-resist material and the second photo-resist material are a positive resist, and the first photo-resist material has a lower resist sensitivity than the second photo-resist material,
   irradiating and subsequently developing the photo-resist material by
      c1) selectively irradiating the first and the second photo-resist layer at an opening region with a first dose;
      c2) selectively irradiating the first and the second photo-resist layer at a cap region with a second dose, which is lower than the first dose; and
      c3) developing the first and the second photo-resist layer to form a cap portion in the first photo-resist layer and a frame portion in the second photo-resist layer, wherein the frame portion runs around the micromechanical structure on the main side of the substrate, and the cap portion spans the mechanical structure from the frame portion with a distance to the micromechanical structure and has the opening; and
   e) closing the opening to close the cavity.

2. The method according to claim 1, wherein the steps c1) and c2) are performed via a single mask.

3. The apparatus according to claim 1, wherein the cavity is sealed from outside of the cavity.

* * * * *

UNITED STATES PATENT AND TRADEMARK OFFICE
CERTIFICATE OF CORRECTION

PATENT NO.         : 7,300,823 B2
APPLICATION NO. : 10/992627
DATED                 : November 27, 2007
INVENTOR(S)      : Martin Franosch et al.

It is certified that error appears in the above-identified patent and that said Letters Patent is hereby corrected as shown below:

Title Page, Item (56) References Cited, U.S. Patent Documents should include:

--2002/0006588 A1    1/2002    Afromowitz--

At column 2, line 4, "polymerisazion" should read --polymerization--

At column 2, line 9, "respectively;" should read --respectively,--

At column 9, line 30, "seperated" should read --separated--

At column 12, line 33, "crosslinking" should read --cross-linking--

At column 13, line 24, "Süs" should read --Süss--

In the Claims:

In Claim 1, line 44, "mechanical" should read --micromechanical--

In Claim 3, line 51, "The apparatus" should read --The method--

Signed and Sealed this

Fifteenth Day of April, 2008

JON W. DUDAS
*Director of the United States Patent and Trademark Office*